United States Patent [19]
Davis et al.

[11] 3,981,762
[45] Sept. 21, 1976

[54] METHOD FOR BONDING RESIN FILM TO METAL

[75] Inventors: Howard G. Davis, Wellesley; Emerson B. Hovey, Wayland; Edwin E. Sylvester, Danvers, all of Mass.

[73] Assignee: USM Corporation, Boston, Mass.

[22] Filed: Aug. 3, 1972

[21] Appl. No.: 278,173

[52] U.S. Cl................................. 156/322; 156/331; 156/333
[51] Int. Cl.².......................... B65C 9/25; C09J 3/14
[58] Field of Search..................... 156/322, 330–334

[56] References Cited
UNITED STATES PATENTS

| | | | |
|---|---|---|---|
| 2,728,703 | 12/1955 | Kiernan et al. | 156/333 |
| 2,877,151 | 3/1959 | Doherty et al. | 156/322 |
| 3,043,794 | 7/1962 | Feiler et al. | 156/331 |
| 3,047,934 | 8/1962 | Magner | 156/322 |
| 3,098,262 | 7/1963 | Wisotzky | 156/322 |
| 3,449,193 | 6/1969 | Bratton et al. | 156/331 |
| 3,718,518 | 2/1973 | Bock et al. | 156/331 |

OTHER PUBLICATIONS

Modern Plastics, vol. 32, No. 10, June 1955, pp. 107–111, 230.

*Primary Examiner*—Douglas J. Drummond
*Attorney, Agent, or Firm*—Richard B. Megley; Vincent A. White; Benjamin C. Pollard

[57] ABSTRACT

Method of bonding a resin film with three-dimensional patterned surface to sheet metal in which a coating of curing adhesive on the metal surface is partially cured to a firmer condition in an initial heating, the metal and adhesive are cooled to a temperature at which the cure rate is slowed but the adhesive is tacky for adhesive engagement with the resin film, the resin film is pressed against the adhesive and the assembly promptly chilled.

8 Claims, 2 Drawing Figures

METHOD FOR BONDING RESIN FILM TO METAL

BACKGROUND OF THE INVENTION

This invention relates to methods for bonding of resin film to metal and particularly for bonding of a thin film with three-dimensional patterned surfaces to sheet metal.

DESCRIPTION OF THE PRIOR ART

A growing field is the bonding of resin films to sheet metal to form a combination sheet having the appearance, feel and corrosion resistance of the resin film with the strength fire resistance and workability of the sheet metal. Deep drawing of such combination sheets imposes great stress on the bond between resin and metal in the localized stretching of metal and resin, and special adhesives and procedures have been needed to form a lasting union. Best results have been obtained with curing-type adhesives using heat and pressure to cure the adhesive and create a firm adhesive joint. However, bonding procedures heretofore developed have been unsatisfactory for bonding thin resin films having three-dimensional patterned surfaces e.g. leather grain or pebble finish, since the procedures flatten out or eliminate the three-dimensional pattern.

BRIEF SUMMARY OF THE INVENTION

It is an object of this invention to provide a method for bonding thin resin films to metal effective to form a strong union while preserving surface character.

To this end and in accordance with a feature of the present invention a curing adhesive is applied to a metal surface, heated to effect rapid partial cure and cooled to a temperature which slows the rate of cure but retains tackiness. A resin film is then pressed against the adhesive and the assembly is rapidly cooled.

BRIEF DESCRIPTION OF THE DRAWINGS

The invention will be described in connection with the attached drawings showning an apparatus which may be used in practicing the method of the present invention.

In the drawings.

DESCRIPTION OF THE PREFERRED EMBODIMENT

Figure 1:
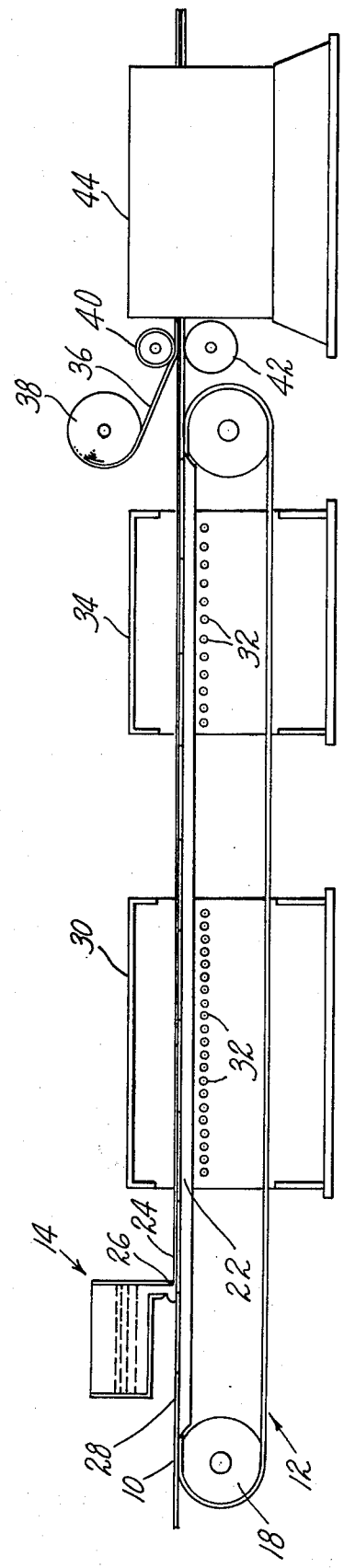
FIG. 1 is a diagrammatic elevational view partly in section of an arrangement of apparatus for practicing the invention.

The method of the present invention including combination of a resin film with metal using a curing adhesive and a special temperature cycle is of particualar value in combining three-dimensional patterned surface thin films which may be in the range of from 2 to 10 mils in thickness, since conventional combining operations have tended to flatten out the surface pattern, but the method may be used in bonding plain surfaced films and films of any thickness. Films for combination may be composed of any of a variety of thermoplastic resins with or without plasticizers. Vinyl resins such as vinyl chloride and vinylidene chloride and copolymers or vinyl chloride and other monomers such as vinyl acetate and ethylene are commercially most important and the method will be described primarily in the use of these materials. However, films of other polymers such as polyamide resins, polyesters and acrylonitrilebutadiene-styrene copolymers (ABS) may be used.

Metal with which the resin film may be combined include steel, galvanized steel, aluminum, titanium and other metals. Although the method may be used with thick bodies of metal, the control of temperature which is important to functioning of the method is more readily achieved with sheet metals of 0.015 inch to 0.060 inch thickness and it is in connection with sheet metal that the generation of localized stresses, as in deep drawing of combination sheets, is a particular problem.

Adhesives for use in the method are of the curing type, particularly urethane or epoxy adhesives including a polyester urethane or polylactone urethane component, for bonding with the resin film and the metal. The term, polyester, will be used herein to refer both to polyesters from reaction of polycarboxylic acids and polyols and to polylactones. These adhesives will be compounded to have stability at room temperature and the ability to be cured in a relatively short time at elevated temperatures. An adhesive which has been found useful may comprise an —NCO terminated prepolymer from reaction of a compound having at least 2 active hydrogen groups such as an —OH terminated polyester or copolyester together with excess of polyisocyanate and a material providing further active hydrogens. This composition may contain other additives such as resin tackifiers or bond improvers such as chlorinated rubber, and mineral fillers, such as titanium dioxide and is ordinarily applied as a volatile organic solvent solution.

One preferred adhesive according to the present invention may contain, based on the solids content, from about 10 to about 25 parts by weight of a mineral filler such as, titanium oxide, from 0 to about 10 parts by weight of chlorinated rubber, from about 35 to about 55 parts by weight of an —NCO terminated prepolymer from reaction of an excess of at least one, preferably, polyfunctional isocyanate having at least some —NCO functionality greater than 2 with at least one —OH terminated polyester, preferably a copolyester from reaction of one or more low molecular weight diols with a mixture of one or more aromatic or aliphatic dicarboxylic acids or anhydrides and one or more aliphatic dicarboxylic acids and from about 5 to about 15 parts by weight of the terpolymer of vinyl chloride, vinyl acetate and maleic anhydride in the ratio by weight of 86:13:1. These components may be dissolved in volatile organic solvents suitably a mixture of toluol, methyl ethyl ketone and methyl isobutyl ketone.

Another useful adhesive may be a solution of a resinous product from forming an —NCO terminated prepolymer such as the prepolymer of the first mentioned adhesive or a prepolymer from reaction of an excess of polyisocyanate with a polylactone alone or in admixture with one or more polyesters, and chain extending the prepolymer with one or more diols such as butane diol and ethylene glycol in amount giving an —OH value of from about 2 to about 5 and having a molecular weight of 20,000 to 30,000. With this material, there is combined from about 50% to about 100% by weight based on the weight of the resin product of a B-stage phenolic resin, from about 50 to about 100% by weight based on the weight of the resin product an epoxy cresol novolac having an epoxide equivalent of 220 to 235 and a melting point at 35° to 100°C. and from about 50 to about 100% by weight based on the weight of the resin product of a terpolymer of vinyl chloride, vinyl acetate and maleic anhydride in the ratio of 86:13:1. The solids are dissolved in suitable solvents such as a mixture of tetrahydrofurane, MEK and acetone.

Figure 2:
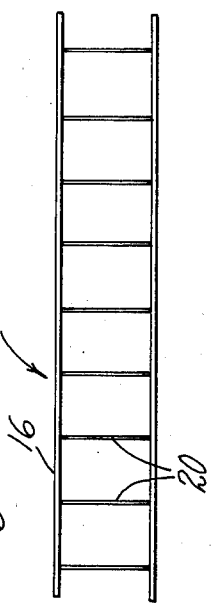
FIG. 2 is a plan view of a portion of the conveyor forming part of the apparatus.

As shown in the drawing, the sheet metal workpiece 10 which is shown as individual sheets but which, of course, may be a continuous strip, is disposed on a conveyor 12 which carries it through the adhesive applying station 14 and the later heating and cooling stations. As shown in FIGS. 1 and 2, the conveyor 12 includes endless side members 16 traveling on the rollers 18 and spaced transverse members 20 which support the workpiece 10 and expose the lower surface 22 of the workpiece for heating or cooling. At the adhesive applying station 14, a coating 24 of a selected curing adhesive is applied by a suitable coating device 26 to the upper surface 28 of the metal workpiece 10 in quantity to provide, after drying, a thickness of adhesive of preferably about 0.0001 inch to about 0.002 inch dry thickness on the metal surface.

The metal workpiece carrying the applied adhesive coating 24 is then heated to evaporate the solvent from the adhesive and effect partial cure to bring the adhesive to a firmer state but not completely to destroy the thermoplastic properties of the adhesive needed to give tackiness and the ability to enter into wetting adhesive engagement with a resin film. Various types of heating may be used such as conductive or convective heating; but it is preferred to carry out the heating by directing infrared heat at the uncoated surface of the metal workpiece to insure uniformity of heating without hot spots.

A first heating may involve passing the coated metal workpiece 10 on the conveyor 12 through a tunnel 30 in which the infrared radiating elements 32 disposed beneath the conveyor 12 raise the temperature of the metal workpiece 10. It has been found desirable that this heating raise the temperature of the metal workpiece and adhesive to a temperature of at least about 400°F. in a period of about 50 seconds. The time and temperature of this first heating step is chosen to give the extent of curing to bring the adhesive to firmer but still tacky state, and a useful heating with a urethane prepolymer adhesive may be from about 400° to about 425°F. with the temperature maintained for about 30 seconds.

After this first heating, the workpiece 10 is brought to a temperature which is below that which will rapidly soften and distort resin film but at which the adhesive coating will be tacky for wetting adhesive engagement with the resin film, suitably, from about 290°F. to about 325°F. For simplicity and control, the workpiece may be cooled below the final desired temperature by loss of heat to air as it leaves the tunnel 30, followed by reheating to the final temperature. But, by suitable control, the workpiece 10 may be brought directly to this temperature without excess cooling and reheating.

Where the workpiece is cooled below the final desired temperature, the workpiece may be reheated, suitably in a second tunnel 34, by radiant heat directed against the uncoated surface of the workpiece 10, to a temperature range selected to be low enough to minimize softening and distortion or flattening of the pattern of the resin film to be adhered and to ensure that the curing of the adhesive does not proceed at a rate to destroy the ability of the adhesive to establish a bond before assembly of the resin film. At the same time, the temperature must be high enough to be effective on the residual thermoplasticity of the adhesive film to bring the adhesive to tacky state capable of entering into wetting adhesive engagement with the resin film. For bonding resin films above 4 mils in thickness, it is preferred to bring the temperature of the adhesive to from about 315°F. to about 325°F. With thinner, less than 4 mils thick, vinyl resin films, it is preferred to use temperatures of from about 290°F. to about 300°F. Because of the initial heating and partial cure of the adhesive, the adhesive at this stage has the ability to form a firm bond to a resin film.

When the workpiece 10 has been brought to the desired temperature either by direct cooling from the first heating or by overcooling after the first station and reheating to the desired temperature, resin film 36 is laid down on the adhesive coating and pressed against it. As shown in the drawing, the resin film 36 is withdrawn from the roll 38 by the driven pressure rolls 40 and 42 and it is combined with the adhesive coating 24 on the workpiece 10 with instantaneous relatively light pressure. Preferably, the roll 40 in contact with the resin film is of a relatively soft rubber, suitably 65 Shore A durometer with a pressure between the rolls of from about 15 to about 20 psi.

The assembly of resin film and metal workpiece passes directly from the pressure rolls to a quenching station 44. Any suitable quenching procedure may be used, such as, spray or a bath of cooling liquid, such as, water, effective to bring the temperature of the assembly quickly down below the distortion point of the resin film 36, preferably, at least below 150°F.

After quenching, the combined resin film and metal workpiece have been found to develop a strength of bond within about 15 minutes in which the combination is capable of withstanding severe physical stress. These tests are set forth in "Commercial Standard CS 245-62 Vinyl to Metal Laminate" published by the U.S. Department of Commerce. For example, one of the tests, 4.3.1.1, involves making cross knife cuts in the vinyl resin at an area of the combined sheet into which a 1 inch diameter ball is forced to make a ⅜ inch dome. On test 4.3.1.1.4, the film was not separable from the metal. After boiling in water for an hour, Test 4.3.1.1.3, there was no adhesive failure.

The following examples are given to aid in understanding the invention; but it is to be understood that the invention does not relate to the particular temperatures, procedures or other details of the examples.

EXAMPLE I

An —NCO terminated prepolymer was prepared by reaction of triphenylmethane triisocyanate with an —OH terminated copolyester from reaction and condensation of isothalic acid, azelaic acid and trimellitic anhydride with a mixture of butane diol and ethylene glycol.

The prepolymer together with the components listed in the following table were dissolved in a mixed solvent comprising about 1 part by volume of tetrahydrofurane, about 2 parts by volume of acetone and about 2 parts by volume of methyl ethyl ketone to form an adhesive having a solids content of about 35%.

|                  | Parts by Weight |
|------------------|-----------------|
| $TiO_2$          | 18              |

-continued

| | Parts by Weight |
|---|---|
| Chlorinated Rubber | 5 |
| —NCO Terminated Prepolymer | 63 |
| Terpolymer of Vinyl Chloride, Vinyl Acetate and Maleic Anhydride in a Ratio of 86:13:1 | 10 |

The resulting solution was stable for periods over 2 weeks at a temperature of 120°F.

The adhesive solution was applied to a galvanized steel sheet of 0.032 inch thickness in quantity to provide after drying a thickness of adhesive about 0.0005 inch on the metal surface.

The metal sheet carrying the applied adhesive was then placed on a conveyor which carried it through a tunnel where the underside was subjected to infrared heat to raise the temperature of the metal workpiece to from about 400° to about 425°C. and it maintained this temperature for about 30 seconds. The heating drove off the solvent from the adhesive and initiated a curing of the adhesive to a state where it was firmer but still tacky. On leaving the tunnel, the workpiece was cooled in air for about 10 seconds which lowered the temperature to below 290°F. Thereafter, the sheet of metal and adhesive were passed through a heating tunnel in which infrared heat was directed against the unheated surface which raised the temperature to the range of 305° to 320°F. in about 20 seconds. On leaving this tunnel, the adhesive was semisolid but its surface was still tacky and capable of wetting and bonding strongly to surfaces brought against it. Directly after leaving the tunnel, a three-dimensional patterned textured plasticized polyvinyl chloride resin sheet having a thickness of 6 mils was laid down on the adhesive surface and passed between nip rolls of which the roll adjacent the resin film was of rubber with a Shore A hardness of 65. The rolls were rotating at a rate giving a linear speed of about 600'/min. and were pressed together with a force such that the pressure on the assembled metal sheet and vinyl resin sheet was about 20 psi. The assembled metal and resin sheet was then passed immediately into a water quenching bath maintained at room temperature.

On examination, the three-dimensional pattern on the surface of the vinyl resin sheet was found to be unharmed by the combining process. The assembly was subjected to Tests 4.3.1.1, 4.3.1.1.3 and 4.3.1.1.4 as set out in "Commercial Standards, CS 245-62, Vinyl to Metal Laminate" published by the U.S. Department of Commerce.

The assembly successfully passed all tests.

EXAMPLE II

An —NCO terminated prepolymer was formed by reaction of polycaprolactone and diphenylmethane diisocyanate. Butane diol was reacted with this prepolymer in amount to give an —OH value of about 3 (mg. KOH), the product having a molecular weight in the range of 20,000 to 30,000.

An adhesive was prepared having composition shown in the following table:

| | Parts by Weight |
|---|---|
| Resin Prepared as Above | 6.8 |
| B-stage Phenolic Resin | 6.8 |
| Novolac-type Epoxy Resin (Epoxy Equivalent 230, Melting Point 80°C. and Molecular Weight 1170) | 3.4 |

-continued

| | Parts by Weight |
|---|---|
| Terpolymer of Vinyl Chloride, Vinyl Acetate and Maleic Anhydride in Ratio of 86:13:1 | 5.7 |
| Tetrahydrofurane | 12.8 |
| Methyl Ethyl Ketone | 41.2 |
| Acetone | 23.3 |

This adhesive was applied to rust resistant (phosphate treated) steel 0.025 inch in thickness in quantity to provide after drying a thickness of adhesive of about 0.0005 inch on the metal surface.

The metal sheet carrying the applied adhesive was subjected to the heat treatment described in Example I, but the second heating was controlled to give a temperature of metal and adhesive in the range of 290° to 300°F. After leaving the tunnel in which it was brought to this temperature, a three-dimensional patterned textured plasticized polyvinyl chloride resin sheet having a thickness of 4 mils was laid down on the adhesive surface and passed between nip rolls and quenched as in Example I.

On examination the three-dimensional pattern on the surface of the resin sheet was found to be unharmed by the combining process.

Sections of the assembly were subjected to Tests 4.3.1.1 and 4.3.1.4 of "Commercial Standards CS 245-62" and successfully passed the tests.

EXAMPLE III

The procedure of Example I was repeated with substitution of aluminum sheet 0.025 inch in thickness for the galvanized steel sheet used in Example I.

The resulting product successfully passed the tests referred to in Example I.

Having thus described our invention what we claim as new and desire to secure as Letters Patent of the United States is:

1. The method of bonding a resin film having a thickness of less than 10 mils and having one surface formed with a three-dimensional pattern to a surface of a metal workpiece comprising the steps of coating a surface of the metal workpiece with a heat-curing adhesive solution in a volatile organic solvent of from about 35 to 55 parts by weight of an —NCO terminated prepolymer from reaction of an excess of a polyfunctional isocyanate with at least one —OH terminated polyester or copolyester, from about 5 to about 15 parts by weight of a terpolymer of vinyl chloride, vinyl acetate and maleic anhydride, up to about 10 parts by weight of chlorinated rubber and from about 10 to about 25 parts by weight of a mineral filler, heating said workpiece to a temperature of at least about 400°F. in a period of about 50 seconds and for a time to drive off said solvent and bring said adhesive to an intermediate state of cure having increased firmness but in which it retains thermoplasticity needed to give tackiness and ability to enter into wetting adhesive engagement with said resin film at the temperature of assembly with said resin film, reducing the temperature of said workpiece to a temperature in the range of from about 290°F. to about 325°F. which is below that which will rapidly soften and distort resin film but which will keep said coating tacky for wetting adhesive engagement with said resin film, laying down said resin film on the tacky adhesive coating, passing said assembly between the nip of rolls to apply momentary pressure to join said resin film to said metal workpiece and directly quenching the assembly of metal workpiece and resin film to below the distortion point of said resin film.

2. The method of bonding a resin film having one surface formed with a three-dimensional pattern to a surface of a sheet metal workpiece as defined in claim 1 in which the initial heating of the metal brings the temperature of the metal workpiece and adhesive to a temperature of at least about 400°F. in a period of about 50 seconds and in which the temperature of the workpiece is brought to the range of from about 290°F. to about 325°F. before laying down said resin film on the tacky adhesive coating.

3. The method of bonding a resin film to a sheet metal workpiece as defined in claim 3 in which the metal workpiece and adhesive are cooled directly after heating to a temperature below about 290°F., the workpiece and coating are reheated to a temperature of from about 290°F. to about 325°F. before laying down the resin film on the tacky adhesive coating and the roll in contact with said resin film at said nip is a rubber roll.

4. The method of bonding a resin film to a sheet metal workpiece as defined in claim 2 in which said adhesive in applied in a layer such that after the solvent is driven off the coating will be from about 0.0001 inch to about 0.002 inch in thickness and the heating is affected by directing radiant heat at an uncoated surface of said workpiece opposite the surface carrying said adhesive.

5. The method of bonding a resin film to a surface of sheet metal workpiece as defined in claim 4 in which the resin of said film comprises at least one member from the group consisting of polymers of vinyl chloride, a copolymer of vinyl chloride and another monomer, polyamide resins, polyester resins and acrylonitrile-butadiene-styrene terpolymers.

6. The method of bonding resin film to a surface of a sheet metal workpiece as defined in claim 5 in which said resin film is up to 4 mils in thickness and in which the temperature of said workpiece and adhesive coating is from about 290°F. to about 300°F. at the time said resin film is laid on the said adhesive coating.

7. The method of bonding a resin film to a surface of sheet metal workpiece as defined in claim 5 in which said resin film is from 4 mils to 10 mils in thickness and in which the temperature of the workpiece and adhesive coating is from about 315°F. to about 325°F. at the time said resin film is laid down on said adhesive coating.

8. The method of bonding a resin film having a thickness of less than 10 mils and having one surface formed with a three-dimensional pattern to a surface of a metal workpiece comprising the steps of coating a surface of the metal workpiece with a heat-curing adhesive solution in a volatile organic solvent of 100 parts by weight of the resinous product from chain extension with at least one organic diol of —NCO terminated prepolymer from combination of an excess of polyisocyanate with an —OH terminated polyester or copolyester or —OH terminated polylactone, the resinous product having an —OH value of from about 2 to about 5 and a molecular weight of from about 20,000 to about 30,000, from about 50 to about 100 parts by weight of a B-stage phenolic resin, from about 50 to about 100 parts by weight of an epoxy novolac having an epoxide equivalent of 220 to 235 and a melting point of from 35° to 100°C., and from about 50 to about 100 parts by weight of a terpolymer vinyl chloride, vinyl acetate and maleic anhydride heating said workpiece to a temperature of at least about 400°F. in a period of about 50 seconds and for a time to drive off said solvent and bring said adhesive to an intermediate state of cure having increased firmness but in which it retains thermoplasticity needed to give tackiness and ability to enter into wetting adhesive engagement with said resin film at the temperature of assembly with said resin film, reducing the temperature of said workpiece to a temperature in the range of from about 290°F. to about 325°F. which is below that which will rapidly soften and distort resin film but which will keep said coating tacky for wetting adhesive engagement with said resin film, laying down said resin film on the tacky adhesive coating, passing said assembly between the nip of rolls to apply momentary pressure to join said resin film to said metal workpiece and directly quenching the assembly of metal workpiece and resin film to below the distortion point of said resin film.

\* \* \* \* \*